United States Patent [19]

Balter

[11] Patent Number: 4,797,053

[45] Date of Patent: Jan. 10, 1989

[54] MANIPULATOR FOR VACUUM APPLICATIONS

[75] Inventor: Valentin Balter, Cupertino, Calif.

[73] Assignee: Huntington Mechanical Laboratories, Inc., Mountain View, Calif.

[21] Appl. No.: 156,340

[22] Filed: Feb. 16, 1988

[51] Int. Cl.[4] .............................................. B65G 54/00
[52] U.S. Cl. ....................................... 414/749; 901/17; 74/479
[58] Field of Search .................... 414/1, 3, 8, 680, 749; 901/17, 16; 74/479

[56] References Cited

U.S. PATENT DOCUMENTS

| | | | |
|---|---|---|---|
| 2,973,107 | 2/1961 | Cherel | 414/3 |
| 3,426,920 | 2/1969 | Chesley | 414/8 |
| 4,300,362 | 11/1981 | Lande et al. | 414/1 X |

*Primary Examiner*—Robert J. Spar
*Assistant Examiner*—Donald W. Underwood
*Attorney, Agent, or Firm*—David Pressman

[57] ABSTRACT

A manipulator for vacuum applications, e.g., for positioning of a specimen at a required point in a vacuum chamber (20) where the specimen can be subjected to ion implantation or similar treatment or measuring procedures, comprises an adjustable angular connector (12) which is formed by two skewed rings (32) and (36) which slide one over another. When the rings rotate, the end of drive shaft (72) describes a planetary path along a circle. The drive shaft (72) has one end connected to a rotary drive mechanism (14) and another end to a driven shaft (92) through a universal joint (90). The lower end of the driven shaft is installed in a rotating manner in a slide (87). The slide (87) is guided in one direction along another slide (84) which in turn is guided in a direction perpendicular to the first one along a rigid frame (80). Planetary motion of driven shaft (92) causes linear motions of the slides (84, 87) in mutually perpendicular directions. As a result, the second slide (87), which carries a sample holder (18), can be installed in any required position within an orthogonal system of coordinates. In addition, the sample holder is rotated from the above-mentioned rotary drive mechanism. The manipulator moves the sample holder with high accuracy since the slide (84) is guided in the rigid frame (80).

12 Claims, 3 Drawing Sheets

MANIPULATOR FOR VACUUM APPLICATIONS

FIELD OF THE INVENTION

The present invention relates to manipulators, particularly to manupulators for accurate positioning of samples in vacuum chambers.

BACKGROUND—CROSS-REFERENCES TO RELATED PATENT AND APPLICATION

This invention is related to U.S. Pat. No. 4,683,763 to V. Balter (1987), entitled "Rotary-Motion Feed-Through Apparatus", U.S. Pat. No. 4,629,219 to V. Balter (1986), entitled "Adjustable Connector Unit", and U.S. patent application Ser. No. 07/143,635, of V. Balter, filed Jan. 13, 1988 and entitled "Polar Coordinate Manipulator for Vacuum Application".

BACKGROUND—DESCRIPTION OF THE PROBLEM

Manufacturing, testing, and studying of semiconductors very often require that a wafer or sample of semiconductor material be transferred in a vacuum chamber from one operating position to another, for example, from an ion-implantation position to a surface-analyzing position. Conventional manipulators for use in vacuum chambers can be roughly divided into two main types.

Manipulators of the first type, such as the model 10-504 of Physical Electronics Industries, Inc., Eden Prairie, Minn., have a drive unit located outside the vacuum chamber. A sample holder with a sample thereon (such as a semiconductor wafer) is manipulated via a long shaft which extends from an external drive unit to a working position within the vacuum chamber. Although a manipulator of this type is convenient since the drive unit is located outside the vacuum chamber, it cannot be used to accurately position a sample because its long shaft deforms (flexes) during use.

Manipulators of the second type, such as the model 15-600 of the above-mentioned company, eliminate the disadvantages inherent in manipulators with long shafts. This is achieved by locating the drive unit within the vacuum chamber. Such a design, however, requires application of three separate rotary drive mechanisms, i.e., two for movements along X and Y axes and one for rotation of the sample holder. Furthermore, the manipulator requires the use of a mechanism for conversion of rotary motions into linear motions, e.g., through a worm wheel, worm, and a lead screw with a nut. This makes the construction expensive, complicated, and inaccurate because of play in the conversion mechanisms.

OBJECTS AND ADVANTAGES OF THE PRESENT INVENTION

It is accordingly an object of the invention to provide a manipulator for a vacuum application which is simple in construction, inexpensive to manufacture, accurate in operation, and does not have disadvantages of long shafts or motion converters. Other objects and advantages of the invention will be understood after consideration of the ensuing description and drawings.

DRAWINGS

REFERENCE NUMERALS USED IN THE SPECIFICATION AND DRAWINGS

Figure 1:
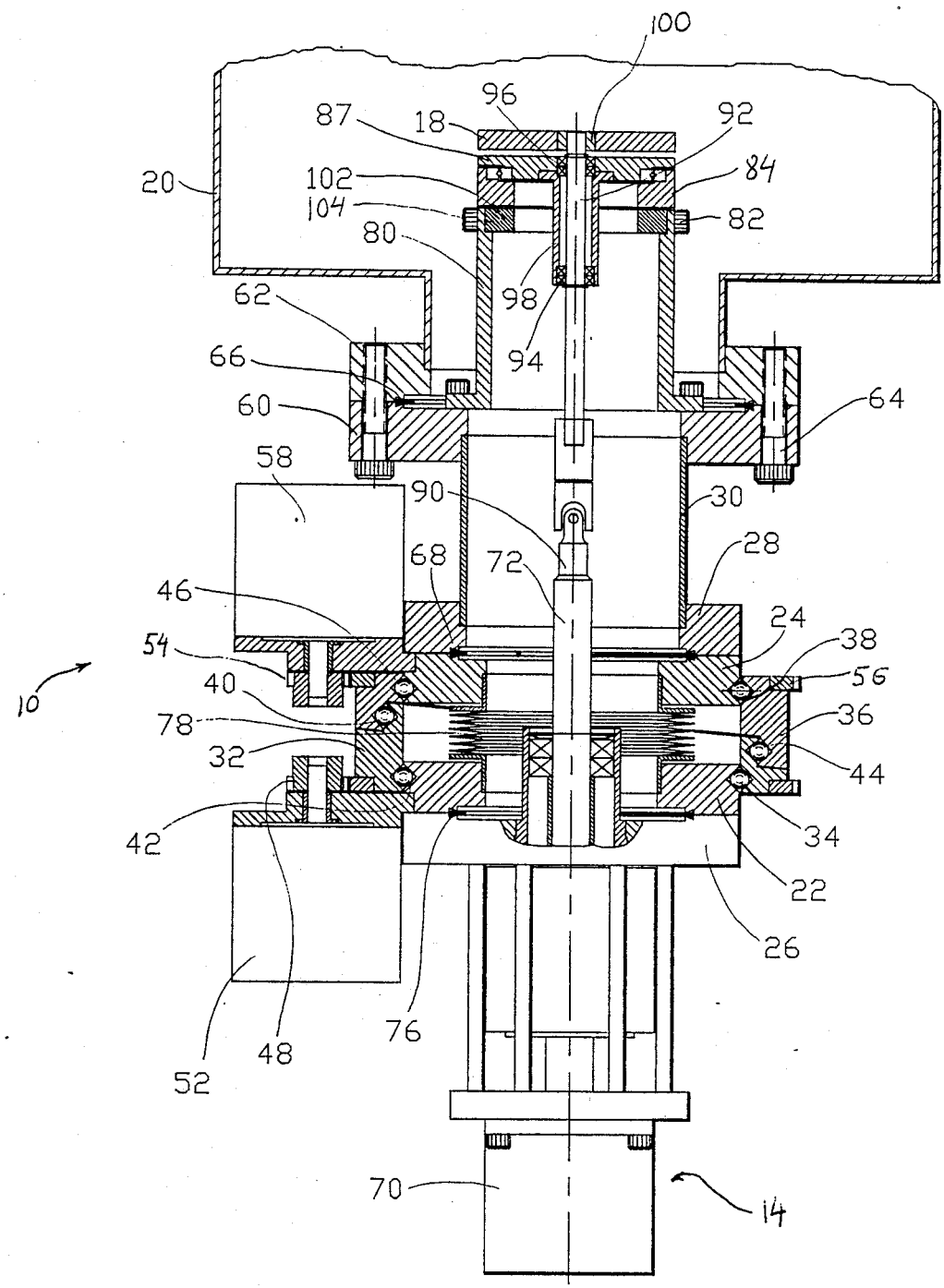
FIG. 1 is a partially-broken side view of a manipulator of the present invention.

10: manipulator
12: adjustable angular connector
14: rotary drive mechanism
16: sample holder positioning mechanism
18: sample holder
20: vacuum chamber
22: first side member
24: second side member
26: mounting flange of rotary drive mechanism 14
28: mounting flange
30: spacer
32: first ring
34: first set of balls
36: second ring
38: second set of balls
40: third set of balls
42: first annular race
44: second annular race
46: third annular race
48: first gear ring
50: gear wheel
52: first pulse motor
54: second gear ring
56: gear wheel
58: second pulse motor
60: flange
62: mounting flange
64: bolts
66, 68: sealing rings
70: pulse motor
72: drive shaft
76: sealing ring
78: bellows
80: frame
82: bolts
84: first slide
86: first set of rollers
87: second slide
88: second set of rollers
90: telescopic universal joint
92: driven shaft
94, 96: bearings
98: hub portion
100: ceramic insulator
102: gap
104: horizontal frame

FIGS. 1, 2, AND 3—DESCRIPTION OF THE PREFERRED EMBODIMENT OF THE INVENTION

Figure 2:
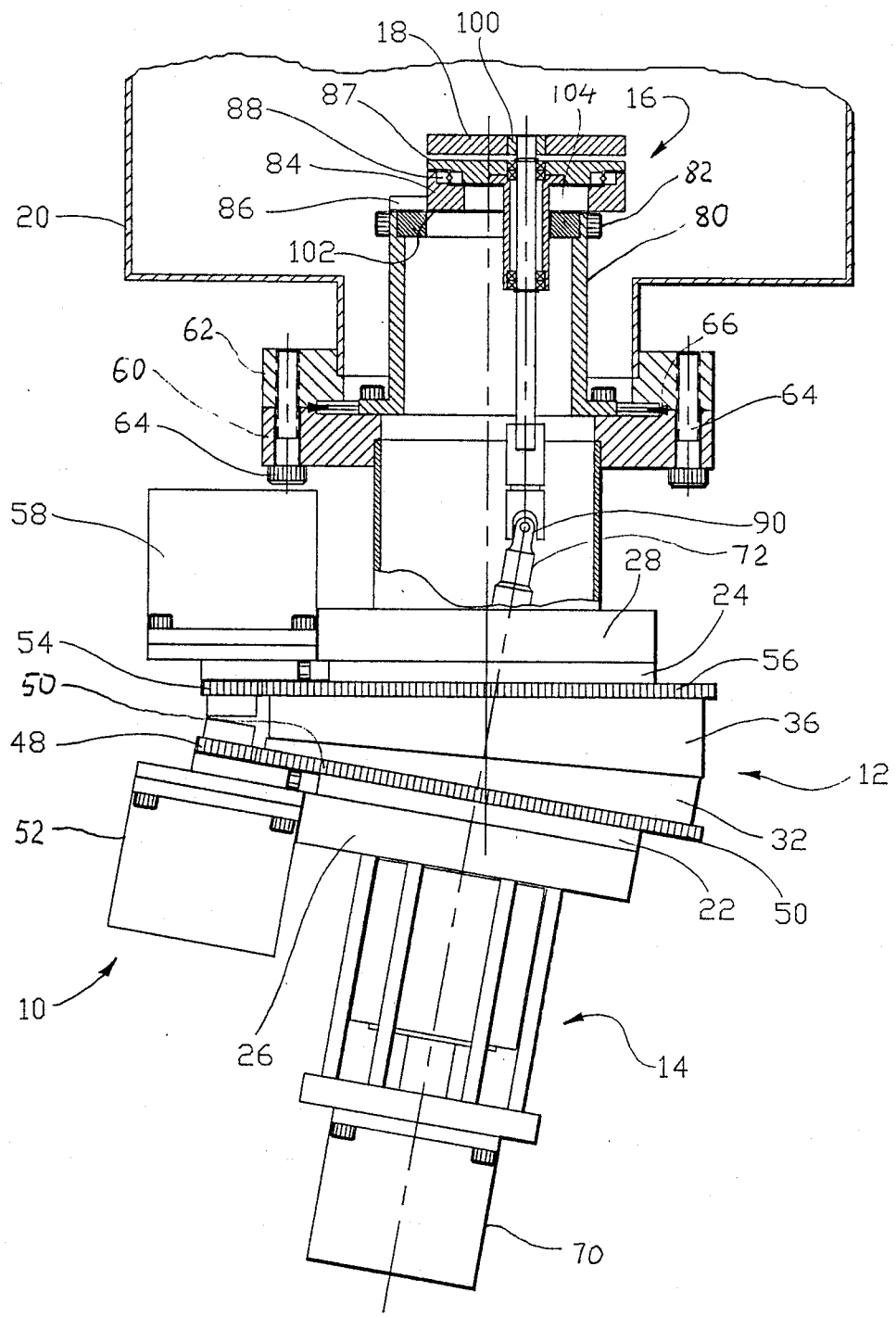
FIG. 2 is the same view as in FIG. 1 with a sample holder in a position shifted to the right side.
Figure 3:
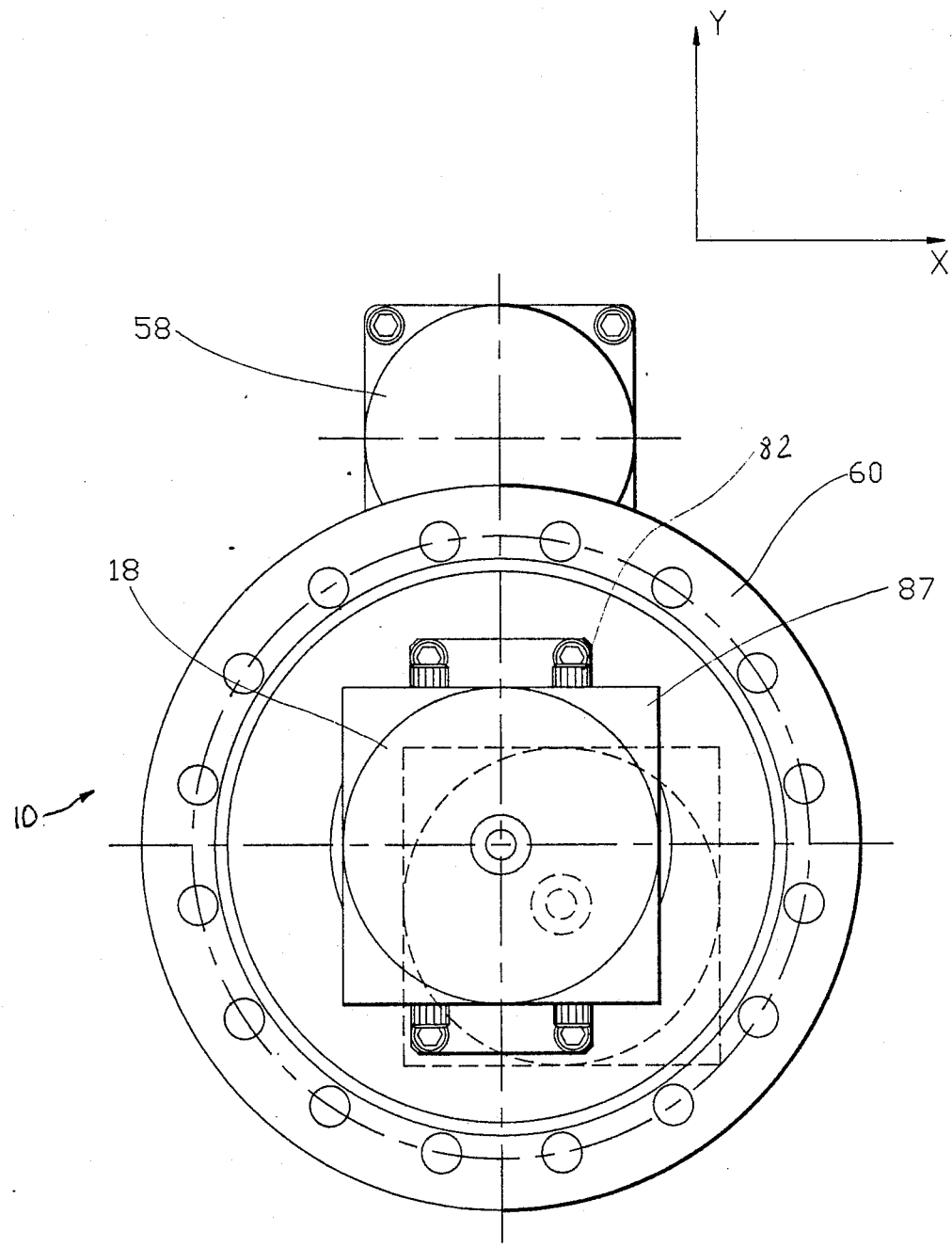
FIG. 3 is a top view of the device shown in the position of FIG. 1.

A manipulator 10 of the present invention for vacuum application is shown in FIGS. 1, 2, and 3. FIG. 1 is a partiallybroken side view; FIG. 2 is a view similar to that of FIG. 1 with a sample holder in a position shifted to the right; and FIG. 3 is a top view of manipulator 10 in the position of FIG. 1.

Manipulator 10 generally consists of three main components, each of which will be described in detail separately. These are an adjustable angular connector 12 (FIG. 2), a rotary drive (feed-through) mechanism 14, and a mechanism 16 for positioning of a sample holder 18 in a vacuum chamber 20.

FIGS. 1 AND 2—DESCRIPTION OF ADJUSTABLE ANGULAR CONNECTOR

An adjustable angular connector 12 (FIG. 2) (which hereinafter will be referred to simply as "angular connector") is a device known per se and described in detail in the above-referred Balter U.S. Pat. No. 4,629,219. Because this unit, however, is an essential element of the present invention, it is worthy of separate description.

Angular connector 12 includes a pair of side members, i.e., a first side member 22 and a second side member 24 which are spaced apart. Side member 22 supports a mounting flange 26 of rotary drive mechanism 14, while side member 24 is attached to a mounting flange 28 of a spacer 30 (FIG. 1). Side member 22 has a ring 32 rotatably mounted thereon by a first set of bearing balls 34, whereas side member 24 has a second ring 36 rotatably mounted thereon by a second set of such balls 38 (FIG. 1). Both rings are rotatably coupled to each other by a third set of bearing balls 40 (FIG. 1). Mating end faces of rings 32 and 36 are skewed (i.e., are not perpendicular) with respect to generatrices of their cylinders, so that when these rings slide with respect to each other, the angle between the longitudinal axes of the cylinders is changed.

Each set of balls is positioned in an annular race formed by a pair of mating grooves. More specifically, balls 34 of the first set are located in a first annular race 42 which is formed between first side member 22 and first ring 32. Balls 40 of the second set are located in a second annular race 44 which is formed between first ring 32 and second ring 36. Balls 38 of the third set are located in a third annular race 46 which is formed between second ring 36 and second side member 24 (FIG. 1).

The balls of each set are fed into a respective race through a hole (not shown) in the respective ring, then the hole is plugged to keep the balls in place. Second annular race 44, which is formed between the above-mentioned rings, is inclined at an angle relative to the race between each side member and the respective ring. Thus, rotation of one ring relative to the other will cause a change in the angular orientation of side members 22 and 24 relative to each other without rotating the side members relative to each other. First ring 32 carries a first gear ring 50 which is rigidly attached thereto. This gear ring is in mesh with a gear wheel 48 which is attached to the output end of a first pule motor 52. In a similar manner, second ring 36 carries a second gear ring 56 which is in mesh with gear wheel 54. This gear wheel is attached to the end of the output shaft of a second pulse motor 58.

The upper end of spacer 30 carries a flange 60 which is used for attachment of angular connector 12 to vacuum chamber 20. For this purpose, flange 60 is connected to a mounting flange 62 of vacuum chamber 20 by bolts 64. A sealing ring 66 is placed between flange 60 and mounting flange 62 of vacuum chamber 20. Another sealing ring 68 (FIG. 1) is placed between second side member 24 and mounting flange 28.

FIGS. 1 AND 2—DESCRIPTION OF ROTARY DRIVE MECHANISM

In the illustrated embodiment, rotary drive mechanism 14 comprises a pulse motor 70, which may be the motor of the same type as the motors 52 and 58. Pulse motor 70 rotates a drive shaft 72.

A sealing ring 76 (FIG. 1) is located between mounting flange 26 of rotary drive mechanism 14 and first ring 22.

Pulse motor 70 is shown only by way of example: the rotary drive mechanism may include any other source of rotation, or drive shaft 72 can be rotated manually.

A typical rotary drive mechanism which can be recommended for manipulators used in vacuum chambers is the one described in the above Balter U.S. Pat. No. 4,683,763.

Drive shaft 72 is surrounded by a bellows 78. One end of the bellows is sealingly welded to the lower surface of first side member 22, while the other end thereof is sealingly welded to second side member 24. Welding is mentioned only as an example since other sealing connections are possible. The interior of manipulator 10, i.e., the space within bellows 78 and within spacer 30, which is connected to vacuum chamber 20, is sealed against the surrounding atmosphere by sealing rings 76, bellows 78, and sealing rings 68 and 66.

FIGS. 1, 2 AND 3—DESCRIPTION OF SAMPLE HOLDER POSITIONING MECHANISM

Located within vacuum chamber 20 is a rigid frame 80 which is removably attached to flange 60, e.g., by bolts 82 (FIGS. 1 and 2). Frame 80 is intended for supporting sample holder positioning mechanism 16. This mechanism comprises a first slide 84 which can slide in the direction of axis Y (FIG. 3) on a first set of rollers 86 placed between the upper end face of frame 80 and the mating surface of the slide. A second slide 87 is supported by first slide 84 (FIGS. 1 and 2) and is moveable by means of a second set of rollers, i.e., rollers 88 (FIG. 2), along slide 84 in X-axis direction (FIG. 3). Thus second slide 87 has two degrees of freedom and can be moved in the direction of either Y, or X axis.

Drive shaft 72 of rotary drive mechanism 14 is connected through a telescopic universal joint 90 to a driven shaft 92 which is supported in a rotating manner by bearings 94 and 96 which are installed in a hub portion 98 of slide 87 (FIG. 1). The term "telescopic" in connection with universal joint 90 means that along with angular articulation, the joint allows slight axial displacements between the connected shafts. The upper end of driven shaft 92 protrudes through slides 84 and 87 through a ceramic insulator 100 to support sample holder 18. Sample holder 18 forms a small gap 102 (FIGS. 1 and 2) with slide 84 and is intended to support a sample (not shown) which can be retained on sample holder 18 by any conventional means, such as screws, etc.

Movements of slide 87 in the direction of axes X and Y can be limited by inner dimensions of a replaceable horizontal frame 104 (FIGS. 1 and 2) which is installed at the upper end of frame 80.

Thus sample holder 18, and hence the sample (not shown), moves in the direction of axes X and Y. Holder 18 moves together with slide 87 which guided by rollers 88 and 86. At the same time holder 18 rotates in bearings 94 and 96. This makes it possible to locate the sample in any required position within the limits allowed by horizontal frame 102.

I prefer that parts of the manipulator of exposed to vacuum be made from stainless steel. Manipulator 10 may have different dimensions as well as different sample holder motion limits. In one practical application the manipulator had the following characteristics: the vertical length from the bottom end of rotary drive unit 14 to the upper surface of flange 60 is 292 mm; the overall horizontal dimension is 190 mm; X movement limit is 25.4 mm; Y movement limit is 25.4 mm, and rotation capacity is 360°.

As stated, the manipulator may be built without pulse motors, i.e., using manual drive for all units. In this case respective scales should be provided on the peripheral surfaces of mating rings 32 and 36.

FIGS. 1-3. OPERATION

Prior to installation of manipulator 10 on vacuum chamber 20 (FIGS. 1 and 2), a sample (not shown) is mounted and fixed to sample holder 18. The length of replaceable frame 80 is arbitrary and is selected and specified by a customer, depending on the particular design and dimensions of vacuum chamber 20, as well as the operating positions for the treatment of the sample within the vacuum chamber. Manipulator 10 is then installed on vacuum chamber 20 by attaching flange 60 of spacer 30 to mounting flange 62 of vacuum chamber 20 by bolts 64.

Operation is started by energizing pulse motors 52 and 58 for simultaneous rotation in opposite directions. The speed of motors and the number of pulses are controlled by a program in accordance with the production cycle. Rotary motion from the motors is transmitted from gears 48 and 56 to gear rings 50 and 54, respectively. Because mutually sliding end faces of rings 32 and 36 are skewed with respect to generatrices of their cylinders, the longitudinal axis of rotary drive unit, which coincides with the direction of drive shaft 72, will describe a conical body of revolution. In other words, when speeds of rotation of both rings 32 and 36 are different, the end of drive shaft 72 will have a circular or planetary path. If both motors rotate in opposite directions with equal speeds, the end of drive shaft 72 will move back and forth along a linear path. These motions are transmitted through universal joint to the lower end of driven shaft 92. Because the upper end of driven shaft 92 is connected to slide 84 which is guided in direction of axes X and Y, planetary motion of the lower end of driven shaft 92 will cause linear displacements of slide 87 controlled from the abovementioned program. As a result, sample holder 18, and hence the sample, will be shifted along the X or Y axes into the required position (FIGS. 3).

Simultaneously with linear motions caused by wobbling of skewed rings 32 and 36, sample holder 18 has a third degree of freedom, i.e., rotation caused by rotary drive unit 70. This still further facilitates manipulation with the sample holder.

Because slide 87 is guided in rigid frame 80, the apparatus can move holder 18 with high accuracy. This accuracy does not depend on the deformations of drive shaft 72 and driven shaft 92, but is determined only by the rigidity of a relatively short and robust frame 80, as well as by the accuracy of guides formed in this frame for the slide. This accuracy is normally within several microns.

SYNOPSIS, RAMIFICATION, AND SCOPE

Thus, as has been shown above, the device of the invention provides simple and reliable means for positioning a sample holder, and hence a sample, at any required point within the working space of a vacuum chamber. The device as simple in construction, inexpensive to manufacture, and provides extremely high accuracy of positioning. As has been described above, high positioning accuracy is achieved due to the fact that final movements of the sample holder are performed by guiding the sample holder in the rigid frame, while long shaft, which is subject to deformations, is used only for transmitting rotary and linear motions to the sample holder from the rotary drive mechanism and from pulse motors.

While the present invention has been illustrated in the form of a specific embodiment shown in FIGS. 1, 2 and 3, those skilled in the art will understand that this embodiment has been given only as an example and that many other modifications are possible within the scope of the appended claims. For example, rings 32 and 36 can be driven manually rather than from pulse motors 52, 58, and drive shaft 72 also can be driven manually rather than by rotary drive mechanism 14. Manipulator 10 itself can be used for manipulating under high-temperatures, or high-pressure conditions instead of a vacuum. Therefore the scope of the invention should be determined, not by the example given, but by appended claims and their legal equivalents.

What I claim is:

1. A manipulator for vacuum applications, comprising:

rotary drive means having a rotating output member;

adjustable angular connection means having first and second side members;

first and second ring members and respective drive means for said ring members, said ring members having guide means and being moveable with respect to each other and with respect to said side members along said guide means, said ring members having mating surfaces which are in contact with each other;

said rotary drive means being attached to said first side member;

said mating surfaces of said ring members being located in a plane which is nonperpendicular to an axis of rotation of said output member, so that roation of said first ring member with respect to said second ring member will cause the side member corresponding to said first ring member to be moved to an angular position relative to said second side member;

rotating driven means connected to said output member through a universal joint which allows angular articulation and axial displacement between said output member and said rotating driven means;

spacing means which embraces said rotating output, said universal joint means, and a part of said rotating driven means, said spacing means having first attachment means for connection to said second side member, and second attachment means for connection to a vacuum chamber;

a rigid frame means connected to the surface of said second attachment means on the side thereof facing said vacuum chamber, so that said frame means extends into the interior of said vacuum chamber;

first sliding means and means for guiding said first sliding means on said frame means for linear movement in one linear direction;

second sliding means and means for guiding said second sliding means on said first sliding means in a second linear direction perpendicular to said one linear direction;

said second sliding means supporting said driven means in a rotating manner;

said driven means passing through said both sliding means so that its end which is opposite to said universal joint means protrudes through said first and second sliding means;

sample holding means which are attached to said protruding end of said driven means so that said sample holding means forms a gap with said second sliding means; and sealing means which seals an interior of said manipulator which communicates with said vacuum chamber, said sealing means surrounding said output member and said driven means.

2. The manipulator of claim 1 wherein said rotating output member comprises an output shaft of said rotary drive means, and said guiding means comprises a first set of balls located in a first circular race formed between said first side member and said first ring member, a second set of balls located in a second race formed between said first ring member and said second ring member, and a third set of balls located in a third race formed between said second set ring member and said second side member, said second race being inclined at an angle to said race between each side member and its respective ring, said driven means comprising a driven shaft.

3. The manipulator of claim 1 wherein said means for guiding said first sliding means on said frame means and said second sliding means on said first sliding means comprises a set of rollers located in guide grooves between said sliding means and said frame and between said first and said second sliding means and oriented in mutually perpendicular directions.

4. The manipulator of claim 1 wherein said sealing means comprises a bellows which sealingly surrounds said output means, said bellows having one end attached to said first side member and another end attached to said second side member, a seal ring between sid rotary drive means and said first side member, a seal ring between said second side member and said first attachment means of said spacing means; and a sealing ring between said second attachment means of said spacing means and said vacuum chamber.

5. The manipulator of claim 1 wherein each said ring member carries a gear ring, said respective drive means of said ring members comprise pulse motors which carry on their output shafts gears which are in mesh with said gear rings.

6. The manipulator of claim 1 wherein all parts exposed to a vacuum are made from stainless steel.

7. A manipulator for vacuum applications, comprising:

a rotary drive mechanism having an output shaft;

an adjustable angular connection unit having first and second side members, said rotary drive mechanism being rigidly attached to said first side member;

first and second ring members and respective drive means for said ring members, said ring members having guide means and being moveable with respect to each other and with respect to said side members along said guide means, said ring members having mating surfaces which are in contact with each other;

said mating surfaces of said ring members being located in a plane which is nonperpendicular to an axis of rotation of said output shaft, so that rotation of said first ring member with respect to said second ring member will cause the side member corresponding to said first ring member to be moved to an angular position relative to said second side member;

a driven shaft connected to said output shaft of said rotary drive mechanism through a universal joint, which allows angular articulation and axial displacement between said output shaft and said driven shaft;

a spacer which embraces said output shaft, said universal joint, and a part of said driven shaft, said spacer having a first flange for connection to said second side member, and a second flange for connection to a vacuum chamber;

a rigid frame connected to the surface of said second flange on the side thereof facing said vacuum chamber, so that said frame extends into the interior of said vacuum chamber;

a first slide and means for guiding said first slide said frame for linear movement in one linear direction;

a second slide and means for guiding said second slide on said first slide in a second linear direction perpendicular to said one linear direction;

said second slide supporting said driven shaft in a rotating manner;

said shaft passing through said both slides, so that its end which is opposite to said universal joint protrudes through said first and second slides;

a sample holder which is attached to said protruding end of said driven shaft, so that said sample holder forms a gap with said second slide;

a bellows which seals an interior of said manipulator which communicates with said vacuum chamber, said bellows surrounding said output shaft;

a first sealing ring between said first side member and said rotary drive mechanism;

a second sealing ring between said second side member and said first flange of said spacer; and a third sealing ring between said second flange of said spacer and said vacuum chamber.

8. The manipulator of claim 7 wherein said guide means for guiding said rings for their relative rotation comprises a first set of balls located in a first circular race formed between said first side member and said first ring member, a second set of balls located in a second race formed between said first ring member and said second ring member, and a third set of balls located in a third race formed between said second ring member and said second side member, said second race being inclined at an angle to said race between each side member and its respective ring.

9. The manipulator of claim 7 wherein said means for guiding said both slides comprise two sets of rollers.

10. The manipulator of claim 7 wherein said bellows has one end attached to said first side member and another end attached to said second side member.

11. The manipulator of claim 7 wherein each said ring member carries a gear ring, said respective drive means of said ring members comprise pulse motors which carry on their output shafts gears which are in mesh with said gear rings.

12. The manipulator of claim 7 wherein all parts exposed to a vacuum are made from stainless steel.

* * * * *